US012682825B2

(12) United States Patent
Kwon et al.

(10) Patent No.: US 12,682,825 B2
(45) Date of Patent: Jul. 14, 2026

(54) DISPLAY DEVICE WITH SELECTIVE HIGH-RATE DRIVING MODE BASED ON MULTI-CHANNEL DATA CHANGE DETECTION

(71) Applicant: SAMSUNG ELECTRONICS CO., LTD., Suwon-si (KR)

(72) Inventors: Taek Su Kwon, Suwon-si (KR); In-Suk Kim, Suwon-si (KR); Dongwook Suh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/823,278

(22) Filed: Sep. 3, 2024

(65) Prior Publication Data

US 2025/0095541 A1 Mar. 20, 2025

(30) Foreign Application Priority Data

Sep. 14, 2023 (KR) ......................... 10-2023-0122745

(51) Int. Cl.
| | |
|---|---|
| *G11C 19/28* | (2006.01) |
| *G09G 3/20* | (2006.01) |
(Continued)

(52) U.S. Cl.
CPC ........... *G09G 3/2096* (2013.01); *G11C 19/28* (2013.01); *G09G 3/20* (2013.01); *G09G 3/3208* (2013.01);
(Continued)

(58) Field of Classification Search
CPC ........ G11C 19/28; G09G 3/20; G09G 3/2096; G09G 3/3208; G09G 3/3275;
(Continued)

(56) References Cited

U.S. PATENT DOCUMENTS

| | | | |
|---|---|---|---|
| 7,760,199 | B2 | 7/2010 | An |
| 8,319,768 | B2 | 11/2012 | Yokota |
(Continued)

FOREIGN PATENT DOCUMENTS

| | | |
|---|---|---|
| KR | 10-0880221 | 1/2009 |
| KR | 10-0880223 | 1/2009 |

*Primary Examiner* — Adam J Snyder
(74) *Attorney, Agent, or Firm* — Fish & Richardson P.C.

(57) ABSTRACT

The present disclosure relates to a display driver integrated circuit and a display device. An example of the display driver integrated circuit includes a source driver and a timing controller. The source driver is configured to output a data voltage based on an image data to a first source line and a second source line. The timing controller is configured to receive first data and second data sequentially input to a first source channel that corresponds to the first source line, receive third data and fourth data sequentially input to a second source channel that corresponds to the second source line, perform an operation on the first data and the second data to generate a first change value, perform an operation on the third data and the fourth data to generate a second change value, and based on the first change value and the second change value, determine whether to toggle an output enable signal on an output of the second data in the first source line and an output of the fourth data in the second source line.

20 Claims, 10 Drawing Sheets

(51) Int. Cl.

| | |
|---|---|
| *G09G 3/3208* | (2016.01) |
| *G09G 3/3275* | (2016.01) |
| *G09G 3/36* | (2006.01) |

(52) U.S. Cl.
CPC ......... *G09G 3/3275* (2013.01); *G09G 3/3688*
(2013.01); *G09G 2310/0267* (2013.01); *G09G*
*2310/027* (2013.01); *G09G 2310/0286*
(2013.01); *G09G 2310/0291* (2013.01); *G09G*
*2310/08* (2013.01); *G09G 2320/043* (2013.01);
*G09G 2330/021* (2013.01); *G09G 2330/023*
(2013.01); *G09G 2330/06* (2013.01)

(58) Field of Classification Search
CPC ......... G09G 3/3688; G09G 2310/0267; G09G
2310/027; G09G 2310/0286; G09G
2310/0291; G09G 2310/08; G09G
2320/043; G09G 2330/021; G09G
2330/023; G09G 2330/06
See application file for complete search history.

(56) References Cited

U.S. PATENT DOCUMENTS

| | | | | |
|---|---|---|---|---|
| 8,648,637 | B2 | 2/2014 | Kim et al. | |
| 10,217,395 | B2 | 2/2019 | Ha | |
| 10,891,914 | B2 | 1/2021 | Seong et al. | |
| 2006/0290638 | A1* | 12/2006 | Kang .................. | G09G 3/3688 |
| | | | | 345/98 |
| 2009/0058838 | A1* | 3/2009 | Lee ..................... | G09G 3/3688 |
| | | | | 345/204 |
| 2009/0207192 | A1 | 8/2009 | Hashimoto | |
| 2009/0309869 | A1 | 12/2009 | Umeda | |
| 2013/0286002 | A1* | 10/2013 | Huang ................ | G09G 3/3688 |
| | | | | 345/99 |
| 2014/0210698 | A1 | 7/2014 | Huang et al. | |
| 2015/0049073 | A1* | 2/2015 | Morita ................ | G09G 3/3688 |
| | | | | 345/211 |
| 2015/0325214 | A1 | 11/2015 | Ryu | |
| 2020/0090580 | A1 | 3/2020 | Hyeon et al. | |
| 2020/0226982 | A1* | 7/2020 | Tung ................... | G09G 3/3275 |
| 2020/0335027 | A1* | 10/2020 | Kim ........................ | G09G 3/20 |
| 2022/0114937 | A1* | 4/2022 | Jung ....................... | G09G 3/20 |
| 2023/0113898 | A1 | 4/2023 | Kim et al. | |

* cited by examiner

| D1 | GRAY(REF1) |
|-----|-----|
| 000 | a0 |
| 001 | a1 |
| 010 | a2 |
| 011 | a3 |
| 100 | a4 |
| 101 | a5 |
| 110 | a6 |
| 111 | a7 |

COM≥REF1 : H
COM<REF1 : L

FIG. 4

| D2 | The Number of Channel (REF2) |
|---|---|
| 000 | c0 |
| 001 | c1 |
| 010 | c2 |
| 011 | c3 |
| 100 | c4 |
| 101 | c5 |
| 110 | c6 |
| 111 | c7 |

$ADDx+1 \geq REF2 : L$
$ADDx+1 < REF2 : H$

DISPLAY DEVICE WITH SELECTIVE HIGH-RATE DRIVING MODE BASED ON MULTI-CHANNEL DATA CHANGE DETECTION

CROSS-REFERENCE TO RELATED APPLICATION

This application claims priority to and the benefit of Korean Patent Application No. 10-2023-0122745 filed in the Korean Intellectual Property Office on Sep. 14, 2023, the entire contents of which are incorporated herein by reference.

BACKGROUND

An electronic device includes a display driver integrated circuit (DDI) for displaying image data on a display panel. As resolution and refresh rates of the display panels continue to increase, high-resolution and high-frequency display driver integrated circuits inevitably use high-rate driving techniques.

There are various techniques to use the high-rate driving techniques, and among them, an output switch control method that basically controls the opening and shorting between a source channel and a source line is used. The output switch control method has a great merit in terms of high-rate operations, but there is a problem in that the electro-magnetic susceptibility (EMI) characteristic is degraded by the current component for controlling an output switch.

SUMMARY

The present disclosure relates to a display driver integrated circuit and a display device, including a display driver integrated circuit for selectively performing high-rate driving and improving an EMI characteristic on the integrated circuit as well as a display driver integrated circuit for increasing a power efficiency of the integrated circuit by selectively performing high-rate driving.

In general, according to some aspects, a display driver integrated circuit including a source drive configured to output a data voltage based on an image data to a first source line and a second source line, the second source line being different from the first source line, and a timing controller configured to receive first data and second data sequentially input to a first source channel that corresponds to the first source line, receive third data and fourth data sequentially input to a second source channel that corresponds to the second source line, perform an operation on the first data and the second data to generate a first change value, perform an operation on the third data and the fourth data to generate a second change value, and based on the first change value and the second change value, determine whether to toggle an output enable signal on an output of the second data in the first source line and an output of the fourth data in the second source line may be provided.

In general, according to some aspects, a display device including a display panel configured to display an image through a source line based on a horizontal synchronization signal, a source driver configured to output a data voltage to the source line based on an output enable signal and a timing controller configured to output the output enable signal toggled at a first line time based on the horizontal synchronization signal and output with a predetermined level for a second line time, the second line time being sequential to the first line time may be provided.

In general, according to some aspects, a display device including a display panel including a plurality of pixels, a gate driver connected to the plurality of pixels through a first gate line and a second gate line that are sequentially arranged, and the gate driver configured to activate the first gate line and the second gate line sequentially, a source driver connected to the plurality of pixels through a plurality of source lines, the source driver configured to output a data voltage to the plurality of pixels through the plurality of source lines based on an output enable signal, be operable in a high-rate driving mode at a first line time that corresponds to activation of the first gate line corresponding to the output enable signal, and turn off the high-rate driving mode at a second line time that corresponds to activation of the second gate line, and a timing controller configured to provide the output enable signal to the source driver, the output enable signal being toggled at the first line time and being output with a predetermined level for the second line time may be provided.

BRIEF DESCRIPTION OF THE DRAWINGS

FIG. 1 shows a block diagram of an example of a display device.

FIG. 3 shows example mode registers.

FIG. 4 shows an example of a driving mode register.

DETAILED DESCRIPTION

Figure 2:
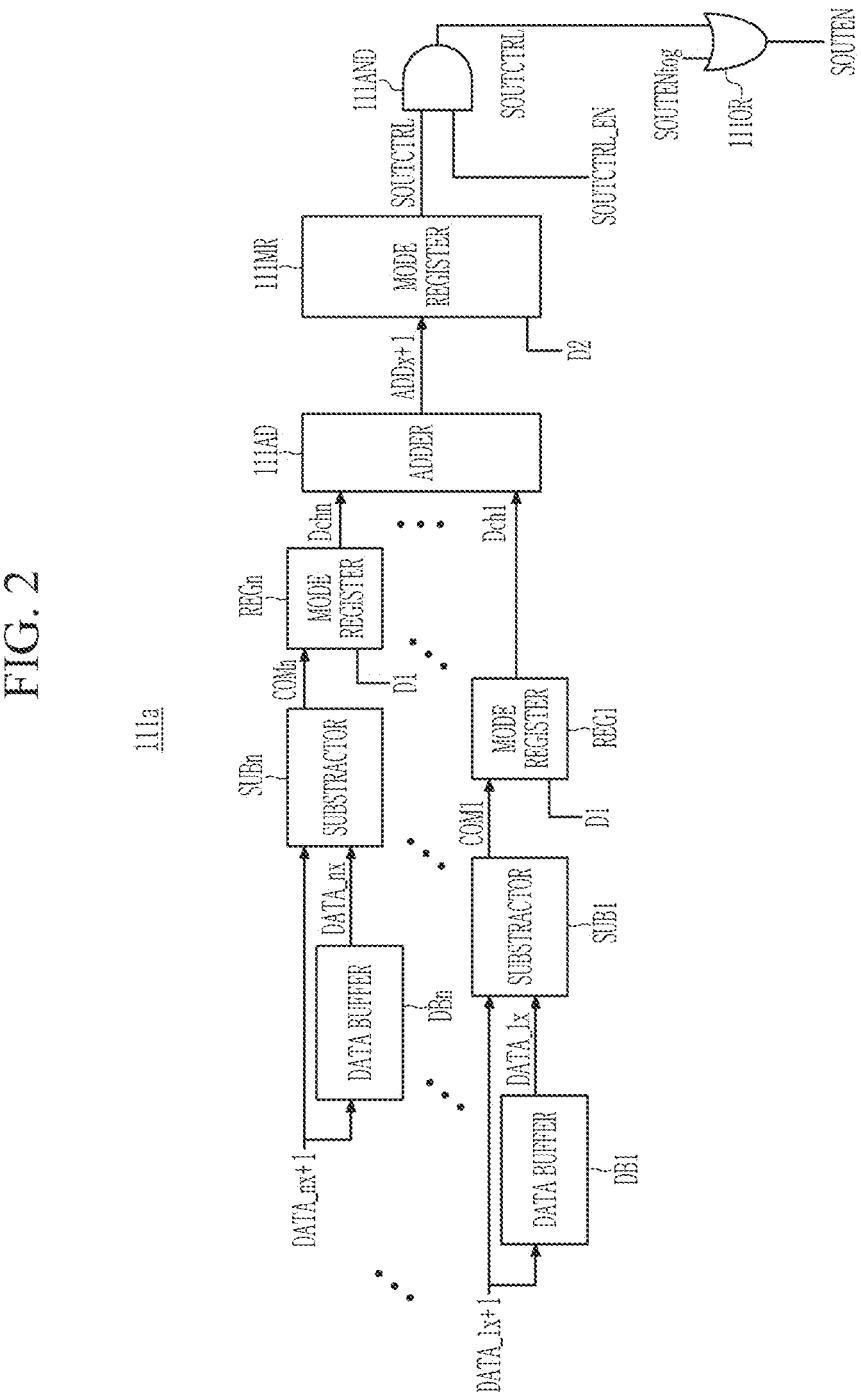
FIG. 2 shows a block diagram of an example of a mode logic circuit.

The present disclosure will be described more fully hereinafter with reference to the accompanying drawings, in which implementations of the disclosure are shown. As those skilled in the art would realize, the described implementations may be modified in various different ways, all without departing from the spirit or scope of the present disclosure.

The drawings and description are to be regarded as illustrative in nature and not restrictive, and like reference numerals designate like elements throughout the specification.

The size and thickness of each configuration shown in the drawings are arbitrarily shown for better understanding and ease of description, but the present disclosure is not limited thereto. The thickness of layers, films, panels, regions, etc., are enlarged for clarity. The thicknesses of some layers and areas are exaggerated for convenience of explanation.

Unless explicitly described to the contrary, the word "comprise", and variations such as "comprises" or "comprising", will be understood to imply the inclusion of stated elements but not the exclusion of any other elements.

Figure 1:
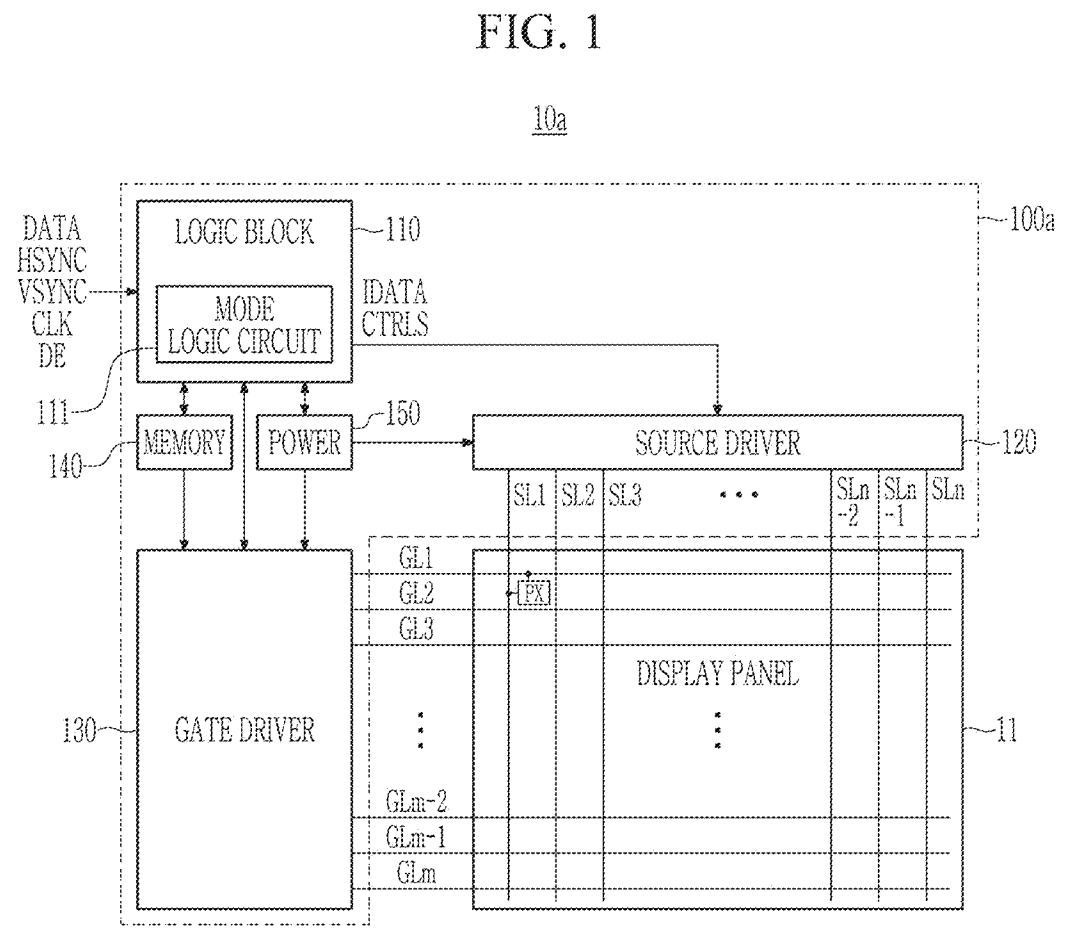

FIG. 1 shows a block diagram of an example of a display device.

Referring to FIG. 1, the display device 10a may include a display driver integrated circuit (DDI) 100a and a display panel 11. The display device 10a may include small electronic devices including a portable communication terminal such as smartphones, a personal digital assistant (PDA), a personal media player (PMP), a wearable device, a camera, a portable game console, an e-book reader, and a tablet PC.

The display driver integrated circuit 100a may include a logic block 110, a source driver 120, a gate driver 130, a memory 140, and a power source 150.

The display panel 11 may include pixels PX. For example, the display device 10a may receive image data from another constituent element (e.g., an application processor (AP)) of an electronic device including the display device 10a. The display device 10a may display received image data (IDATA) or an image corresponding to the received image data through pixels PX of the display panel 11.

The display panel 11 may include the pixels PX. The respective pixels PX are connected to a corresponding gate line from among gate lines GL1 to GLm that are sequentially arranged and a corresponding source line from among source lines SL1 to SLn that are sequentially arranged. The respective pixels PX may display image information corresponding to voltages or signals in response to the voltages (or signals) of the corresponding gate line and corresponding source line, and. The respective pixels PX may display any one of colors. For example, one pixel may display any one color: red, green, or blue.

Depending on the implementation, the display panel 11 may be implemented as an organic light emitting diode (OLED) display panel. For example, a gate terminal of the transistor may be connected to one of the gate lines GL1 to GLm. The first terminal (e.g., source) of the transistor may be connected to one of the source lines SL1 to SLn. The second terminal (e.g., drain) of the transistor may be connected to the diode.

An example of how the display panel 11 may be implemented is not limited to what is shown in FIG. 1. For example, the display panel 11 may be implemented with various types of display panels, such as a liquid crystal display (LED) panel. In this case, the pixels PX may include constituent elements that are different from what are shown in FIG. 1. For example, when the display panel 11 is implemented as an LED panel, the respective pixels PX may include liquid crystal instead of a diode, depending on the implementation. In this case, the display device 10a may further include constituent elements such as backlight.

Depending on the implementation, the logic block 110 may be referred to as a timing controller or may include a timing controller.

The logic block 110 may receive image data (IDATA) to be displayed on the display panel 11, and timing signals such as a horizontal synchronization signal (HSYNC), a vertical synchronization signal (VSYNC), a clock signal (CLK), and a data enable signal (DE) from the outside of the display device 10a. The logic block 110 may generate a variety of control signals (CTRLS) such as an output enable signal to control the source driver 120, the gate driver 130, the memory 140, and the power source 150 based on the timing signals.

For example, the logic block 110 may generate control signals for controlling the source driver 120 and the gate driver 130 so that the pixels PX included in the display panel 11 may display corresponding image information. For example, the logic block 110 may generate control signals (CTRLS) for controlling the source driver 120 based on the timing signals received from an external device.

The logic block 110 may include a mode logic circuit 111. The mode logic circuit 111 may operate a data variation width between the image data (IDATA) to be continuously input to the source lines through the respective source channels in the source driver 120, and may check the number of source channels whose data variation width is greater than or equal to a predetermined reference value. The mode logic circuit 111 may determines whether to toggle an output enable signal for the source driver 120 based on the number of the confirmed source channels, and may output the output enable signal whose toggling is determined. When the output enable signal is toggled, the level of the output enable signal may be switched differently from the level of the existing signal. For example, when the output enable signal is output as a high level signal, the output enable signal may be output as a low level signal by toggling the output enable signal.

The mode logic circuit 111 may determine the driving mode of the display driver integrated circuit 100a along with whether to toggle the output enable signal. A detailed description of the mode logic circuit 111 will be described later with reference to FIG. 2 to FIG. 4.

The source driver 120 may provide image information to be displayed to the pixels PX through the source lines SL1 to SLn under the control of the logic block 110. For example, the source driver 120 may convert the image data (IDATA) into data voltages to be displayed on the display panel 11 in response to the control signals (CTRLS) generated by the logic block 110. The source driver 120 may provide data voltages to the pixels PX through the source lines SL1 to SLn.

Additionally, the source driver 120 includes source channels respectively connected to the source lines SL1 to SLn. One source channel includes a source decoder for selecting one of gamma voltages generated by a gamma voltage generator based on an input data signal, and a source amplifier for amplifying or buffering the selected gamma voltage and providing the same to the pixels PX as a data voltage within a predetermined time. A detailed description of the configuration and operation of the source driver 120 will be described later with reference to FIG. 5 to FIG. 7.

The gate driver 130 may control the gate lines GL1 to GLm under the control of the logic block 110. For example, the gate driver 130 may sequentially provide gate signals to the sequentially arranged gate lines GL1 to GLm. The gate signal may activate the pixels PX connected to the corresponding gate line.

The memory 140 may also be referred to as a graphic memory or a graphic random access memory (GRAM). The memory 140 may receive data to be output through source driver 120 from logic block 110, and may store the data. For example, the logic block 110 may transmit the image data (IDATA) received from an outside of the display device 10 to the memory 140. Differing from what is shown in FIG. 1, the memory 140 may directly transmit the stored data to the source driver 120 under the control of the logic block 110.

For example, when a still image is displayed through the display device 10, the memory 140 may prevent the display device 10 from continuously receiving other image data from an external device by outputting the stored image data (IDATA). The memory 140 may lower the power consumed by the display device 10 and may reduce heat generation of the display device 10. Contrary to what is shown, the display driver integrated circuit 100a may not include the memory

140. Unlike what is shown, the display driver integrated circuit 100a may include two or more memories.

The power source 150 may supply power to the logic block 110, the source driver 120, the gate driver 130, and the memory 140. The power source 150 may supply the power for driving respective constituent elements of the display device 10.

Depending on the implementation, the display device 10 may display images by frame. The time for displaying one frame may be defined as a vertical synchronization signal (VSYNC) in a vertical period. The vertical period may be determined by the refresh rate of the display device 10. For example, when the refresh rate of the display device 10 is 60 Hz, the vertical period may be 1/60 second, approximately 16.7 ms.

During one vertical period, the gate driver 130 may scan the respective gate lines GL1 to GLm. For example, the gate driver 130 may sequentially apply gate signals to the gate lines GL1 to GLm under the control of the logic block 110. The time for the gate driver 130 to scan the gate lines GL1 to GLm may be defined as a horizontal period. The horizontal period may be the same as the period of the horizontal synchronization signal (HSYNC), and may also have the same time interval as line times (line1 to line5) of FIG. 7.

During one horizontal period, the source driver 120 may apply a gray voltage to the pixels PX of the display panel 11. The gray voltage may be a data voltage output from the source driver 120 based on the image data (IDATA). By the gray voltage, the brightness of the pixels PX of the display panel 11 may be determined.

FIG. 2 shows a block diagram of an example of a mode logic circuit. FIG. 3 shows example mode registers. FIG. 4 shows an example of a driving mode register.

Referring to FIG. 1 and FIG. 2, the mode logic circuit 111a may determine whether to toggle an output enable signal (SOUTEN) by comparing sequentially input data, and may output the output enable signal (SOUTEN). Corresponding to the determination of whether to toggle the output enable signal (SOUTEN), it may be determined whether to operate a high-rate driving mode of the display driver integrated circuit 100a.

The mode logic circuit 111a may include data buffers DB1 to DBn, subtractors SUB1 to SUBn, mode registers REG1 to REGn, an adder 111AD, a driving mode register 111MR, an AND operator 111AND, and an OR operator 111OR.

The data buffers DB1 to DBn may receive data DATA_1x-DATA_nx and DATA_1x+1-DATA_nx+1 to be input to source channels that correspond to the source lines SL1 to SLn. For example, the first data buffer DB1 may sequentially receive first_x data (DATA_1x) and first_x+1 data (DATA_1x+1) to be sequentially displayed as images through the first source line SL1. In some implementations, the number of the data buffers DB1 to DBn may be equal to the number of the source lines SL1 to SLn of FIG. 1, but they are not limited thereto.

The data buffers DB1 to DBn may store previous data (DATA_1x to DATA_nx) that are image data input to the logic block 110, and may provide them to the subtractors SUB1 to SUBn. The data buffers DB1 to DBn may provide the previous data (DATA_1x to DATA_nx) to the subtractors SUB1 to SUBn, and may store the input data (DATA_1x+1 to DATA_nx+1) that are input just after them.

For example, the first data buffer DB1 may store the first_x data (DATA_1x) that are input just before the first_x+1 data (DATA_1x+1), may provide them to the first subtractor SUB1, and may store the first_x+1 data (DATA_1x+1).

The subtractors SUB1 to SUBn may receive the previous data (DATA_1x to DATA_nx) and the input data (DATA_1x+1 to DATA_nx+1), and may perform a subtraction operation on the previous data (DATA_1x to DATA_nx) and the input data (DATA_1x+1 to DATA_nx+1) to operate change values (COM1 to COMn) that are data variation widths between the previous data (DATA_1x to DATA_nx) and the input data (DATA_1x+1 to DATA_nx+1).

For example, the first subtractor SUB1 may receive the first_x data (DATA_1x) and the first_x+1 data (DATA_1x+1), and may operate a first change value COM1 that is the data variation width between the first_x data (DATA_1x) and the first_x+1 data (DATA_1x+1). In some implementations, the first_x data (DATA_1x) and the first_x+1 data (DATA_1x+1) may be 8-bit digital data and may be one of the total of 256 digital data of [00000000] to [11111111]. Therefore, the first change value COM1 may be the data that correspond to one of 0 to 255 that may be the variation width between the first_x data (DATA_1x) and the first_x+1 data (DATA_1x+1).

The descriptions of the first subtractor SUB1 and the first change value COM1 are an example, and the present disclosure is not limited thereto.

The mode registers REG1 to REGn receive change values (COM1 to COMn) from the subtractors SUB1 to SUBn, and determine the data variation widths of the respective source channels based on the change values (COM1 to COMn) and the first input data D1 to output channel determination values (Dch1 to Dchn).

Additionally referring to FIG. 3, the mode registers REG1 to REGn may perform a comparison operation based on the input change value (COM) from among the data reference value REF1 that corresponds to the first input data D1 and the change values (COM1 to COMn). For example, the first mode register REG1 may perform a determination operation by comparing the data reference value REF1 and the first change value COM1 input to the first mode register REG1, and may output the first channel determination value Dch1 according to the determination operation.

When the change value (COM) is equal to or greater than the data reference value REF1, the mode registers REG1 to REGn may determine that the data variation width is big in the corresponding source channel, and may output channel determination values (Dch1 to Dchn) based on the determination. In some implementations, as shown in FIG. 3, the mode registers REG1 to REGn may determine the data variation width of the corresponding source channel to be big and may output a channel determination value of a high level signal.

When the change value (COM) is less than the data reference value REF1, the mode registers REG1 to REGn determines the data variation width of the corresponding source channel to be not big, and may output the channel determination values (Dch1 to Dchn). In some implementations, as shown in FIG. 3, the mode registers REG1 to REGn may determine the data variation width of the corresponding source channel to be not big, and may output the channel determination value of a low level signal.

The data reference value REF1 may be one that corresponds to the first input data D1 from among 0-th to seventh data reference values a0 to a7 stored in the mode registers REG1 to REGn. Referring to FIG. 3, the number of the data reference values stored in the mode registers REG1 to REGn is shown to be 8, and the number of the data reference values is not limited thereto.

The 0-th to seventh data reference values (a0 to a7) may correspond to the data variation widths between the first_x data (DATA_1x) and the first_x+1 data (DATA_x+1). For example, when the first_x data (DATA_1x) and the first_x+1 data (DATA_1x+1) are 8-bit digital data, the respective 0-th to seventh data reference values (a0 to a7) may be one of 0 to 255.

The bit number of the first input data D1 may be determined by the number of the data reference values stored in the mode registers REG1 to REGn, and the bit number of the first input data D1 may be 3 based on the number 8 that is the number of the stored 0-th to seventh data reference values (a0 to a7) as shown in FIG. 3 according to the implementation.

In some implementations, the first input data D1 may be stored as one time programmable (OTP) data according to an effusing or anti-effusing method on an OTP element in the display device 10a of FIG. 1. In some implementations, the data reference value REF1 may be stored in an OTP data form and may be predetermined by the first input data D1 that are OTP data and the mode registers REG1 to REGn.

The descriptions on the first data buffer DB1, the first subtractor SUB1, and the first mode register REG1 may also be applied to the data buffers DB1 to DBn, the subtractors SUB1 to SUBn, and the mode registers REG1 to REGn.

The adder 111AD may receive channel determination values (Dch1 to Dchn) from the mode registers REG1 to REGn, may add the channel determination values (Dch1 to Dchn), and may provide the added value (ADDx+1) on the input data (DATA_1x+1 to DATA_nx+1) to the driving mode register 111MR.

The driving mode register 111MR may receive the added value (ADDx+1) from the adder 111AD, and may check the number of the source channels with big data variation widths based on the added value (ADDx+1) and the second input data D2. The driving mode register 111MR may output an output enable control signal (SOUTCTRL) for determining whether to drive the display driver integrated circuit 100a at a high rate and whether to toggle the output enable signal (SOUTEN) when performing an output operation on the input data (DATA_1x+1 to DATA_nx+1).

Additionally referring to FIG. 4, the driving mode register 111MR may perform a comparison operation based on a channel reference value REF2 that corresponds to the second input data D2 and the added value (ADDx+1) to determine whether to operate a high-rate driving mode on the display driver integrated circuit 100a.

When an output operation on the input data (DATA_1x+1 to DATA_nx+1) is performed and there are many source channels having a big data change, a time for a gamma voltage generator to provide a gamma voltage to the source amplifier may increase. The display driver integrated circuit 100a may be operated in the high-rate driving mode and may reduce the time used in providing the gamma voltage to provide the data voltage to the pixels PX within a predetermined time. The output enable signal (SOUTEN) may be toggled so that the display driver integrated circuit 100a may be normally operated without changes of the data voltage in the high-rate driving mode.

On the contrary, when an output operation on the input data (DATA_1x+1 to DATA_nx+1) is performed and there are not many source channels with big data changes, the time for the gamma voltage generator to provide the gamma voltage to the source amplifier may be short. Therefore, the high-rate driving mode of the display driver integrated circuit 100a is not needed, and the output enable signal (SOUTEN) may be output on a constant level.

The driving mode register 111MR may determine that the high-rate driving mode of the display driver integrated circuit 100a is needed when the added value (ADDx+1) is equal to or greater than the channel reference value REF2. The driving mode register 111MR may output the output enable output signal (SOUTCTRL) based on the determination. In some implementations, as shown in FIG. 4, the driving mode register 111MR may determine that the high-rate driving mode of the display driver integrated circuit 100a is needed, and may output the output enable control signal (SOUTCTRL) of a low level signal.

The driving mode register 111MR may determine that the high-rate driving mode of the display driver integrated circuit 100a is not needed when the added value (ADDx+1) is less than a channel reference value REF2. The driving mode register 111MR may output the output enable output signal (SOUTCTRL) based on the determination. In some implementations, as shown in FIG. 4, the driving mode register 111MR may determine that the high-rate driving mode of the display driver integrated circuit 100a is not needed, and may output the enable control signal (SOUTC-TRL) of a high level signal.

The channel reference value REF2 may be one of the 0-th to seventh channel reference values (c0 to c7) stored in the driving mode register 111MR and corresponding to the second input data D2. Referring to FIG. 4, the number of the data reference values stored in the driving mode register 111MR is shown to be 8, and is not limited thereto.

The respective 0-th to seventh channel reference values (c0 to c7) may be integers within the source line number of the source lines SL1 to SLn. For example, when the number of the source lines SL1 to SLn is 2520, the respective 0-th to seventh channel reference values (c0 to c7) may be an integer of one of 0 to 2520.

The bit number of the second input data D2 may be determined by the number of the channel reference values stored in the driving mode register 111MR, and the bit number of the second input data D2 may be 3 based on the number 8 that is the number of the stored 0-th to seventh data reference values (a0 to a7) as shown in FIG. 4 according to the implementation.

In some implementations, the second input data D2 may be stored as OTP data according to the effusing or anti-effusing method on the OTP element in the display device 10a of FIG. 1. In some implementations, the channel reference value REF2 may be stored in an OTP data form and may be predetermined by the second input data D2 that are OTP data and the driving mode register 111MR.

The AND operator 111AND may receive the output enable control signal (SOUTCTRL) from the driving mode register 111MR and may receive the control enable signal (SOUTCTRL_EN) as an active signal on the output enable control signal (SOUTCTRL).

When the control enable signal (SOUTCTRL_EN) is a high level, the AND operator 111AND may activate the output enable control signal (SOUTCTRL). The AND operator 111AND is a masking unit for the output enable control signal (SOUTCTRL), and it may control an output of the output enable control signal (SOUTCTRL).

The OR operator 111OR may receive an output enable toggle signal (SOUTENtog) that is constant and is repeatedly toggled with a period of the line time of the horizontal synchronization signal (HSYNC) or the source driver 120 and the output enable control signal (SOUTCTRL). The OR operator 111OR may perform an OR operation on the output enable control signal (SOUTCTRL) and the output enable toggle signal (SOUTENtog) to generate an output enable signal (SOUTEN).

Figure 7:
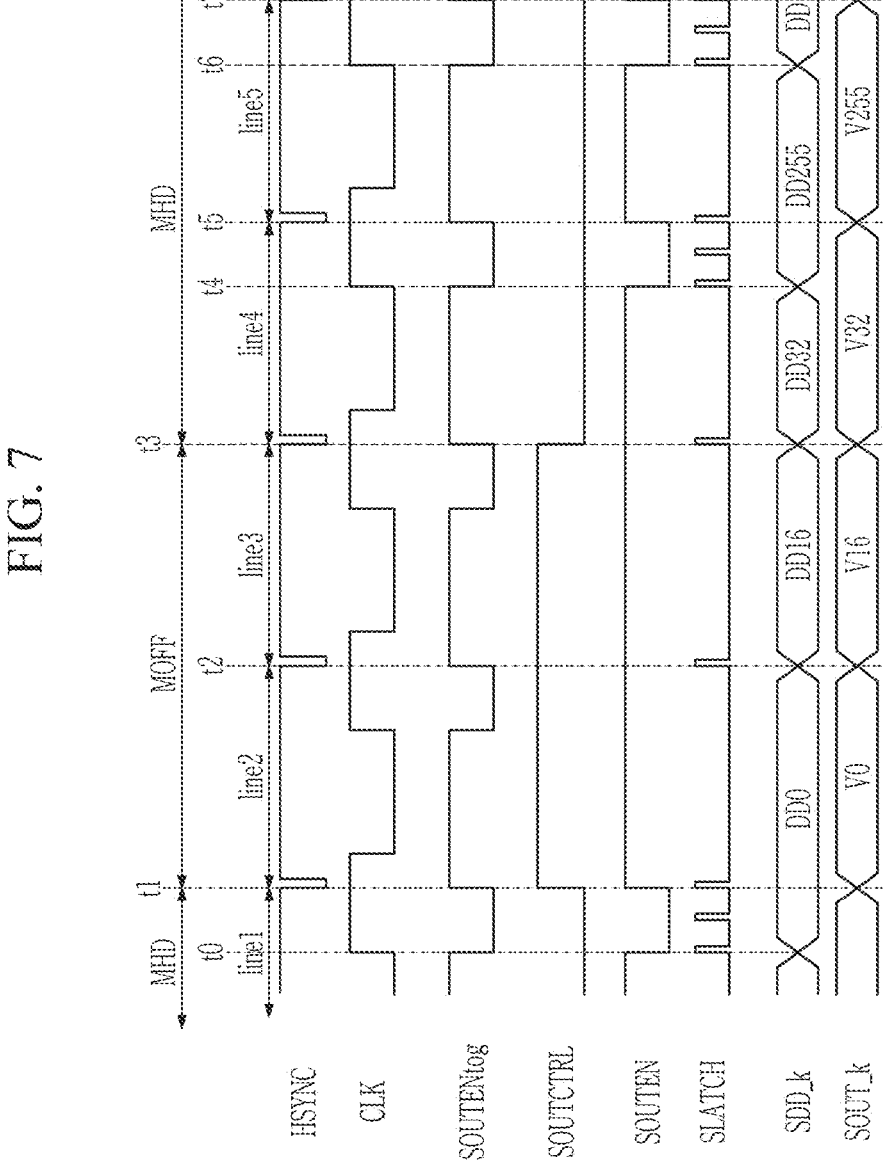
FIG. 7 shows a timing diagram for an example of an operation of a display device.

Referring to FIG. 7, when the output enable control signal (SOUTCTRL) is a low level within the period or the line time of one horizontal synchronization signal (HSYNC), the output enable signal (SOUTEN) is toggled, and when the output enable control signal (SOUTCTRL) is a high level within the period or the line time of the one horizontal synchronization signal (HSYNC), the output enable signal (SOUTEN) may output a signal on a constant high level.

Figure 5:
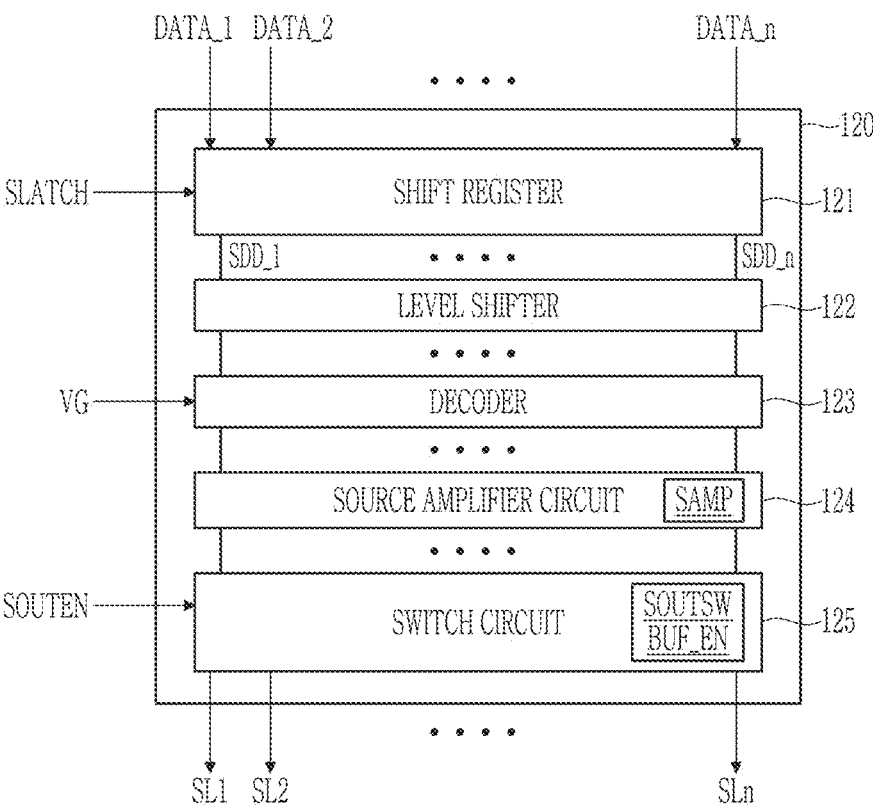
FIG. 5 shows a block diagram of an example of a source driver.
Figure 6:
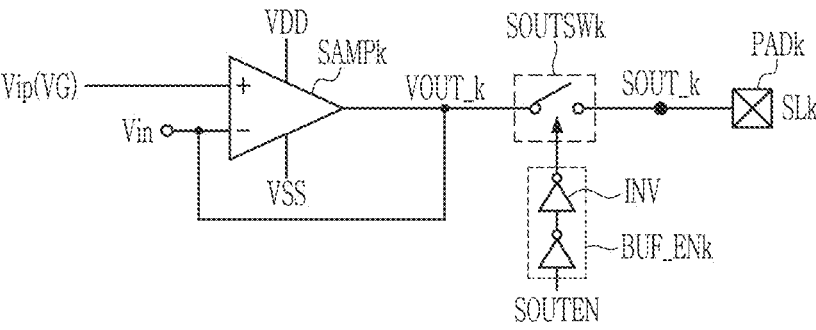
FIG. 6 shows an example of a source amplifier, an example of an output switch, and an example of an output pad.

FIG. 5 shows a block diagram of an example of a source driver. FIG. 6 shows an example of a source amplifier, an example of an output switch, and an example of an output pad.

Referring to FIG. 1, FIG. 2, FIG. 5, and FIG. 6, the source driver 120 may include a shift register 121, a level shifter 122, a decoder 123, a source amplifier circuit 124, and a switch circuit 125. Constituent elements 121, 122, 123, 124, and 125 in the source driver 120 are not limited to the shown implementation, and may be modifiable to many other forms.

The shift register 121 may receive first to n-th data (DATA_1-DATA_n) that are image data and a latch signal (SLATCH) from the logic block 110. The latch signal (SLATCH) may be a signal for indicating that new data to be output by the source driver 120 are received to the shift register 121 (or a signal for indicating that the data stored in the shift register 121 are updated to an output terminal).

The latch signal (SLATCH) may be toggled for multiple times in one line time when the display driver integrated circuit 100a is operated in the high-rate driving mode. For example, in one line time, while the output enable signal (SOUTEN) is toggled to a low level signal, the latch signal (SLATCH) may be toggled for multiple times and may be input to the shift register 121. The latch signal (SLATCH) may be toggled based on the horizontal synchronization signal (HSYNC) when the display driver integrated circuit 100a is not driven at a high rate. In some implementations, the latch signal (SLATCH) may be toggled at a rising edge or a falling edge of the horizontal synchronization signal (HSYNC) and may be input to the shift register 121.

The shift register 121 may sample the first to n-th data (DATA_1 to DATA_n) and may store them under the control of the logic block 110. The shift register 121 may sample the first to n-th data (DATA_1 to DATA_n) and may transmit latch digital data (SDD_1 to SDD_n) latched to an output terminal of the shift register 121 to the level shifter 122. In some implementations, the shift register 121 may include a sampling circuit for sampling data and a holding latch for storing the data sampled by the sampling circuit.

The level shifter 122 may receive the latch digital data (SDD_1 to SDD_n) from the shift register 121 and may transmit an output signal of which a voltage level is shifted to the decoder 123 to swing between target voltage levels.

The decoder 123 may receive the output signal of the level shifter 122 and gamma voltages (VG). The display driver integrated circuit 100a may further include a gamma voltage generator for generating the gamma voltages (VG) that correspond to various levels of luminance. The number of the gamma voltages (VG) may be determined based on the number of colors displayable through the display panel 11 or the bit number of image data provided by the outside of the display device 10a.

For example, when the first to n-th data (DATA_1 to DATA_n) are 8-bit digital data, the number of the gamma voltages (VG) may be 256 corresponding to the bit number of the first to n-th data (DATA_1 to DATA_n).

The decoder 123 may select one of the gamma voltages (VG) in response to the output signal of the level shifter 122.

The decoder 123 may output the selected gamma voltage to the source amplifier circuit 124. The decoder 123 may be realized with a digital-to-analog converter.

Although not shown, the decoder 123 may include source decoders corresponding to the source lines SL1 to SLn. The respective source decoders may be included in the source channels that correspond to the source lines SL1 to SLn.

The source amplifier circuit 124 may include a source amplifiers (SAMP). The source amplifiers (SAMP) may include a source amplifier (SAMPk) connected to one source line (SLk) of the source lines SL1 to SLn. The k is an arbitrary integer of 1 to n.

The source amplifier (SAMPk) may be realized with an operational amplifier. The source amplifier (SAMPk) may include a positive input terminal for receiving an input voltage (Vip), a negative input terminal for receiving an input voltage Vin, and an output terminal for outputting an output voltage (VOUT_k). The source amplifier (SAMPk) may receive voltages (VDD and VSS) from the power source 150. The negative input terminal of the source amplifier (SAMPk) may be connected to an output terminal of the source amplifier (SAMPk). For example, the output voltage (VOUT_k) may be input to the source amplifier (SAMPk) as an input voltage Vin. The source amplifier (SAMPk) may be realized with a unit buffer.

The source amplifier (SAMPk) may receive the gamma voltage (VG) selected by the decoder 123 as an input voltage (Vip) to amplify the same, and may output a data voltage (or a gray voltage) as an output voltage (VOUT_k) to provide the same to an output switch (SOUTSWk) of the switch circuit 125.

Regarding the source amplifier circuit 124, when there are many source amplifiers (SAMP) for receiving the gamma voltage having a great voltage difference from the gamma voltage that is just input, a time for preparing the gamma voltage for an input of the source amplifiers (SAMP) may increase. By this, the shift register 121 may perform a pre-latch operation that corresponds to the high-rate driving mode to obtain the increased time. Through the pre-latch operation, the shift register 121 may update the stored latch digital data (SDD_1 to SDD_n) to the output terminal in advance.

Regarding the source amplifier circuit 124, when there are not many source amplifiers (SAMP) for receiving the gamma voltage having a great voltage difference from the gamma voltage that is just input as an input, the time for preparing the gamma voltage for the input of the source amplifiers (SAMP) may be short. In this case, the pre-latch operation of the shift register 121 is not needed.

The switch circuit 125 may receive an output enable signal (SOUTEN) from the logic block 110, and may receive output voltages of the source amplifiers (SAMP) as data voltages. The switch circuit 125 may output the received data voltage to the source lines SL1 to SLn or may intercept it based on the output enable signal (SOUTEN).

The switch circuit 125 may include output switches (SOUTSW) operable based on the output enable signal (SOUTEN), and output enable buffers (BUF_EN) for receiving the output enable signal (SOUTEN) and providing the output enable signal (SOUTEN) to the output switches (SOUTSW).

The output switches (SOUTSW) may include an output switch (SOUTSWk) connected between one source amplifier (SAMPk) of the source amplifiers (SAMP) and an output pad (PADk), and the output enable buffers (BUF_EN) may include an output enable buffer (BUF_ENk) for providing the output enable signal (SOUTEN) to the output switch (SOUTSWk). The k may be an arbitrary integer of 1 to n.

The output enable buffer (BUF_ENk) may receive the output enable signal (SOUTEN) from the logic block 110, and may maintain the input output enable signal (SOUTEN) as a buffer.

In some implementations, the output enable buffer (BUF_ENk) may include internal inverters (INV). When a switching operation or a toggle on the output enable signal (SOUTEN) is not generated, a dynamic current may not flow to the output enable buffer (BUF_ENk), and a charging and discharging operation on the internal inverter (INV) may not be performed. When the switching operation or the toggle on the output enable signal (SOUTEN) is not generated, the source driver 120 including the switch circuit 125 may have an improved EMI characteristic and may be operable with low power.

The output switch (SOUTSWk) may connect the source amplifier (SAMPk) and the output pad (PADk) or cancel the connection in response to the output enable signal (SOUTEN).

For example, the output switch (SOUTSWk) may be opened or short-circuited in response to the output enable signal (SOUTEN). An output voltage (VOUT_k) of the source amplifier (SAMPk) may applied to the source line (SLk) through the output pad (PADk) as the source output voltage (SOUT_k) of the source driver 120 in response to it that the output switch (SOUTSWk) is short-circuited. In response to it that the output switch (SOUTSWk) is opened, an output of the source output voltage (SOUT_k) on the output pad (PADk) and the source line (SLk) may be intercepted. The source output voltage (SOUT_k) is an output voltage of the source driver 120, and may be a data voltage to be output to the source line (SLk).

To prevent changes of the data voltages output through the source lines SL1 to SLn in the case of a pre-latch operation of the shift register 121, the output enable signal (SOUTEN) may be toggled and the output switches (SOUTSW) may be opened.

In some implementations, the data latch signal (SLATCH) and the output enable signal (SOUTEN) may be included in control signals (CTRLS) generated by the logic block 110.

FIG. 7 shows a timing diagram for an example of an operation of a display device.

Referring to FIG. 1, FIG. 2, and FIG. 5 to FIG. 7, the horizontal synchronization signal (HSYNC) may be toggled for a predetermined period. Constituent elements of the display driver integrated circuit 100a may be operable according to the period of the horizontal synchronization signal (HSYNC) or the horizontal synchronization signal (HSYNC).

The line times (line1 to line5) may be defined based on falling edge intervals of the horizontal synchronization signal (HSYNC), and without being limited thereto, the line times may be defined based on the rising edges of the horizontal synchronization signal (HSYNC) depending on the implementation.

The sequential first to fifth line times (line1 to line5) define based on the horizontal synchronization signal (HSYNC) may correspond to activation operations of the sequentially arranged gate lines (GL1 to GLm).

For example, when the first gate line GL1 is activated at the first line time (line1), the second gate line GL2 may be activated at the second line time (line2), the third gate line GL3 may be activated at the third line time (line3), the fourth gate line GL4 may be activated at the fourth line time (line4), and the fifth gate line GL5 may be activated at the fifth line time (line5), but the display driver integrated circuit 100a is not limited to the above-described operational example.

The period of the clock signal CLK may correspond to the period of the horizontal synchronization signal (HSYNC). In some implementations, a duty ratio of the clock signal CLK may be lower than the duty ratio of the horizontal synchronization signal (HSYNC), but is not limited thereto. The display driver integrated circuit 110a may generate control signals (CTRLS) based on the clock signal CLK.

The output enable toggle signal (SOUTENtog) may be generated based on the clock signal CLK and the horizontal synchronization signal (HSYNC). The output enable toggle signal (SOUTENtog) may be toggled with the same period as the clock signal CLK and the horizontal synchronization signal (HSYNC).

The output enable toggle signal (SOUTENtog) may be transitioned to a low level signal and may be output at the rising edge of the clock signal CLK, and it may be transitioned to a high level signal and may be output at the falling edge of the horizontal synchronization signal (HSYNC). For example, the output enable toggle signal (SOUTENtog) may be transitioned to a low level signal at the time t0 that is at the rising edge of the clock signal CLK and may be transitioned to a high level signal at the time t1 that is at the falling edge of the horizontal synchronization signal (HSYNC). That is, the output enable toggle signal (SOUTENtog) may be output and toggled to a low level signal between the time t0 and the time t1.

The driving mode register 111MR of the mode logic circuit 111a may output the output enable control signal (SOUTCTRL) of a low level signal at the first line time (line1) before the time t1, may output the output enable control signal (SOUTCTRL) of a high level signal between the time t1 and the time t3 that correspond to the second and third line times (line2 and line3), and may output the output enable control signal (SOUTCTRL) of a low level signal at the fourth and fifth line times (line4 and line5) after the time t3.

Additionally referring to FIG. 2 and FIG. 4, the display driver integrated circuit 100a may be operable in a high-rate driving mode (MHD) at the first line time (line1) before the time t1. The display driver integrated circuit 100a may be operable in an Off mode (MOFF) in which the high-rate driving is turned off between the time t1 and the time t3 that correspond to the second and third line times (line2 and line3). The display driver integrated circuit 100a may be operable in the high-rate driving mode (MHD) at the fourth and fifth line times (line4 and line5) after the time t3.

The output enable signal (SOUTEN) may be generated by the mode logic circuit 111a based on the output enable toggle signal (SOUTENtog) and the output enable control signal (SOUTCTRL)

The output enable signal (SOUTEN) may be transitioned to a low level signal and may be toggled at the time t0 in the first line time (line1). The output enable signal (SOUTEN) may be output as a high level signal for the second line times (line2 and line3). The output enable signal (SOUTEN) may be transitioned to a low level signal and may be toggled at the time t4 in the fourth line time (line4). The output enable signal (SOUTEN) may be transitioned to a low level signal and may be toggled at the time t6 in the fifth line time (line5).

The display driver integrated circuit 100a may be operable in the high-rate driving mode (MHD) at the first line time (line1).

The output enable signal (SOUTEN) may be transitioned to a low level signal and may be toggled from the time t0 in the first line time (line1), and the output enable signal (SOUTEN) may be toggled to a low level signal and may be output at the first line time (line1) after the time t0.

While the output enable signal (SOUTEN) is toggled to a low level signal from the falling edge of the output enable signal (SOUTEN), the shift register 121 may receive a latch signal (SLATCH) that is toggled for multiple times from the logic block 110, and may pre-latch digital data to an output terminal of the shift register 121 based on the latch signal (SLATCH). For example, the shift register 121 may pre-latch the 0-th digital data DD0 as latch digital data (SDD_k) based on the latch signal (SLATCH) at the first line time (line1).

The output switches (SOUTSW) in the switch circuit 125 may be opened by a low level signal output of the output enable signal (SOUTEN). As the output switches (SOUTSW) are opened, a data voltage output of the pre-latched digital data may be intercepted. For example, the output switch (SOUTSWk) may intercept the 0-th digital data DD0 pre-latched at the first line time (line1) from being output to the source output voltage (SOUT_k) for the source line (SLk).

At the time t1 when the first line time (line1) ends, the output enable signal (SOUTEN) may be transitioned to a high level signal and may be output. By the high level signal output of the output enable signal (SOUTEN), the output switches (SOUTSW) in the switch circuit 125 may be short-circuited. As the output switches (SOUTSW) are short-circuited, the data voltage of the pre-latched digital data may be output. For example, at the time t1, the 0-th voltage V0 that corresponds to the pre-latched 0-th digital data DD0 may be output as the source output voltage (SOUT_k) for the source line (SLk) through the output switch (SOUTSWk).

At the second line time (line2), the display driver integrated circuit 100a may be operable in the Off mode (MOFF). During the second line time (line2), the output enable signal (SOUTEN) may be output as a high level signal, and after the time t1, the latch signal (SLATCH) may not be toggled. Therefore, during the second line time (line2), the shift register 121 does not perform the pre-latch operation. For example, during the second line time (line2) after the time t1, the shift register 121 does not perform a latch operation to thus maintain the latch of the 0-th digital data DD0 at the output terminal of the shift register 121.

As the output enable signal (SOUTEN) is output as a high level signal, the output switches (SOUTSW) in the switch circuit 125 may be short-circuited during the second line time (line2). As the output switches (SOUTSW) are short-circuited, the operation for intercepting the outputting of the data voltage to the source lines SL1 to SLn may not be performed.

At the time t2 when the second line time (line2) ends, the shift register 121 may receive the toggled latch signal (SLATCH) from the logic block 110 and may latch digital data to the output terminal of the shift register 121 based on the latch signal (SLATCH). As the output switches (SOUTSW) are short-circuited, the data voltage of the latched digital data may be output. For example, at the time t2, the shift register 121 may latch sixteenth digital data DD16 as the latch digital data (SDD_k) based on the latch signal (SLATCH), and a sixteenth voltage V16 that corresponds to the latched sixteenth digital data DD16 may be output as the source output voltage (SOUT_k) for the source line (SLk) through the output switch (SOUTSWk).

At the third line time (line3), the display driver integrated circuit 100a may be operable in the Off mode (MOFF). During the third line time (line3), the output enable signal (SOUTEN) may be output as a high level signal, and after the time t2, the latch signal (SLATCH) may not be toggled. Therefore, during the third line time (line3), the shift register 121 does not perform the pre-latch operation. For example, during the third line time (line3) after the time t2, the shift register 121 does not perform the latch operation so the latch of the sixteenth digital data DD16 may be maintained at the output terminal of the shift register 121.

As the output enable signal (SOUTEN) is output as a high level signal, the output switches (SOUTSW) in the switch circuit 125 may be short-circuited during the third line time (line3). As the output switches (SOUTSW) are short-circuited, the intercepting operation on the outputting of data voltage to the source lines SL1 to SLn may not be performed.

At the time t3 when the third line time (line3) ends, the shift register 121 may receive the toggled latch signal (SLATCH) from the logic block 110 and may latch digital data to the output terminal of the shift register 121 based on the latch signal (SLATCH). Further, as the output switches (SOUTSW) are short-circuited, the data voltage of the latched digital data may be output. For example, at the time t3, the shift register 121 may latch thirty-second digital data DD32 as latch digital data (SDD_k) based on the latch signal (SLATCH), and the thirty-second voltage V32 that corresponds to the latched thirty-second digital data DD32 may be output as the source output voltage (SOUT_k) for the source line (SLk) through the output switch (SOUTSWk).

At the fourth line time (line4), the display driver integrated circuit 100a may be operable in the high-rate driving mode (MHD). The output enable signal (SOUTEN) may be transitioned to a low level signal and may be toggled from the time t4 in the fourth line time (line4), and the output enable signal (SOUTEN) may be toggled to a low level signal and may be output at the fourth line time (line4) after the time t4.

While the output enable signal (SOUTEN) is toggled to a low level signal from the falling edge of the output enable signal (SOUTEN), the shift register 121 may receive the latch signal (SLATCH) that is toggled for multiple times from the logic block 110 and may pre-latch digital data to the output terminal of the shift register 121 based on the latch signal (SLATCH). For example, at the fourth line time (line4), the shift register 121 may pre-latch 255-th digital data DD255 as latch digital data (SDD_k) based on the latch signal (SLATCH).

As the output enable signal (SOUTEN) is output as a low level signal, the output switches (SOUTSW) in the switch circuit 125 may be opened. As the output switches (SOUTSW) are opened, the outputting of the data voltage of the pre-latched digital data may be intercepted. For example, the output switch (SOUTSWk) may intercept the outputting of the 255-th digital data DD255 pre-latched at the fourth line time (line4) as the source output voltage (SOUT_k) for the source line (SLk).

At the time t5 when the fourth line time (line4) ends, the output enable signal (SOUTEN) may be transitioned to a high level signal and may be output. As the output enable signal (SOUTEN) is output as a high level signal, the output switches (SOUTSW) in the switch circuit 125 may be short-circuited. As the output switches (SOUTSW) are short-circuited, the data voltage of the pre-latched digital data may be output. For example, at the time t5, the 255-th voltage V255 that corresponds to the pre-latched 255-th digital data DD255 may be output as the source output voltage (SOUT_k) for the source line (SLk) through the output switch (SOUTSWk).

At the fifth line time (line5), the display driver integrated circuit 100*a* may be operable in the high-rate driving mode (MHD). The output enable signal (SOUTEN) may be transitioned to a low level signal and may be toggled from the time t6 in the fifth line time (line5), and the output enable signal (SOUTEN) may be toggled to a low level signal and may be output at the fifth line time (line5) after the time t6.

While the output enable signal (SOUTEN) is toggled to a low level signal from the falling edge of the output enable signal (SOUTEN), the shift register 121 may receive the latch signal (SLATCH) that is toggled for multiple times from the logic block 110 and may pre-latch digital data to the output terminal of the shift register 121 based on the latch signal (SLATCH). For example, at the fifth line time (line5), the shift register 121 may pre-latch 128-th digital data DD128 as latch digital data (SDD_k) based on the latch signal (SLATCH).

As the output enable signal (SOUTEN) is output as a low level signal, the output switches (SOUTSW) in the switch circuit 125 may be opened. As the output switches (SOUTSW) are opened, the data voltage output on the pre-latched digital data may be intercepted. For example, the output switch (SOUTSWk) may intercept the outputting of the 128-th digital data DD128 pre-latched at the fifth line time (line5) as the source output voltage (SOUT_k) for the source line (SLk).

At the time t7 when the fifth line time (line5) ends, the output enable signal (SOUTEN) may be transitioned to a high level signal and may be output. As the output enable signal (SOUTEN) is output as a high level signal, the output switches (SOUTSW) in the switch circuit 125 may be short-circuited. As the output switches (SOUTSW) are short-circuited, the data voltage of the pre-latched digital data may be output.

The display driver integrated circuit 100*a* may be operated in the high-rate driving mode (MHD) at the first line time (line1), the fourth line time (line4), and the fifth line time (line5), and may be operated in the Off mode (MOFF) at the second and third line times (line2 and line3) from among the sequential first to fifth line times (line1 to line5).

At the second and third line times (line2 and line3), as the display driver integrated circuit 100*a* is operated in the Off mode (MOFF), the output enable signal (SOUTEN) input to the output enable buffers (BUF_EN) in the switch circuit 125 is not toggled or switched so no dynamic current is generated to the output enable buffers (BUF_EN).

As the dynamic current is prevented from being generated by the output enable buffers (BUF_EN), an EMI characteristic of the source driver 120 that is an integrated element is improved and a power efficiency of the source driver 120 may be improved.

The display driver integrated circuit 100*a* may selectively operate the high-rate driving mode (MHD) through the mode logic circuit 111*a*. According to the selective operation of the high-rate driving mode (MHD), the display driver integrated circuit 100*a* may perform high-rate driving at the line time requiring high-rate driving and may improve the EMI characteristic and power efficiency of the source driver 120.

Figure 8:
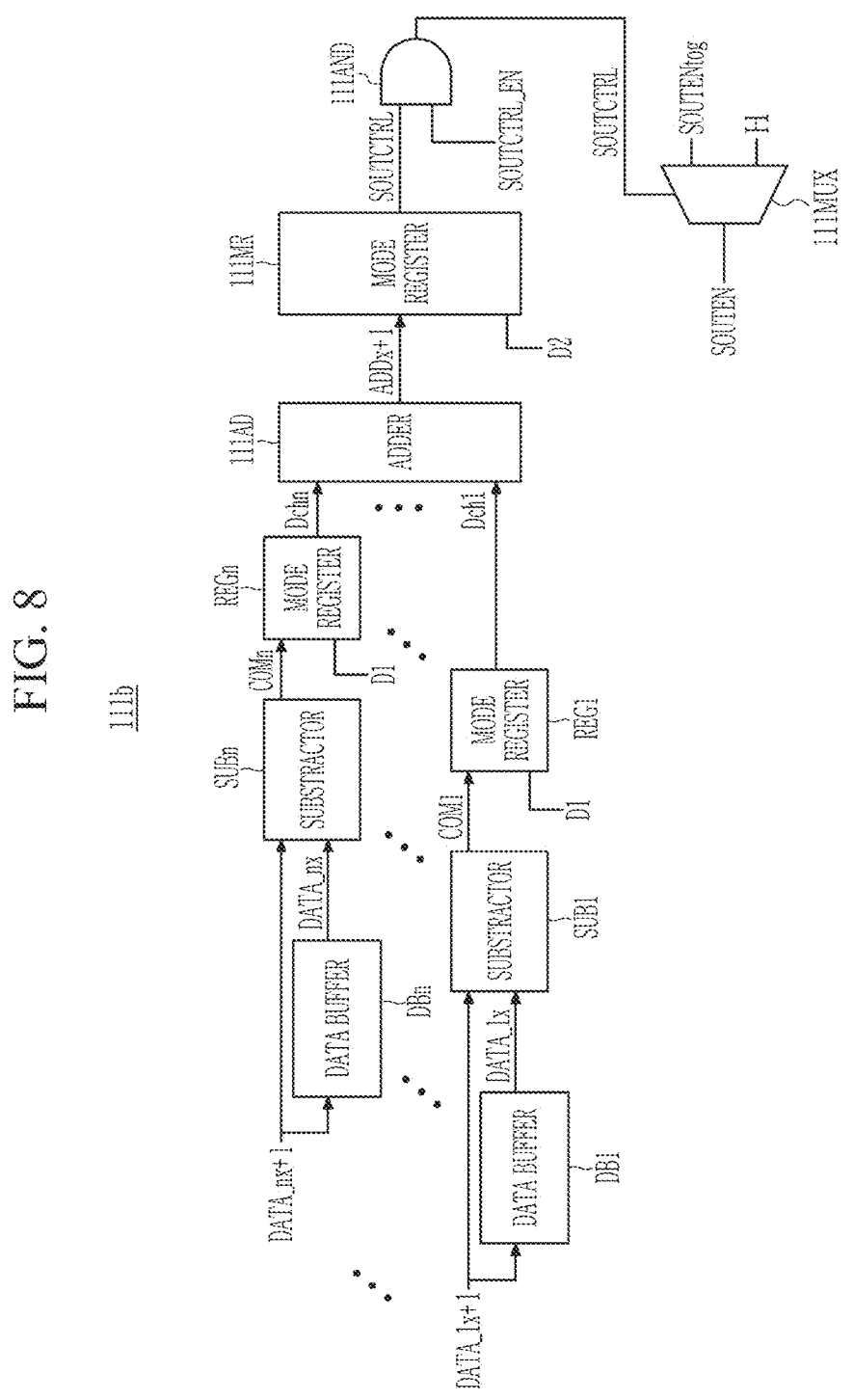
FIG. 8 shows a block diagram of another example of a mode logic circuit.

FIG. 8 shows a block diagram of another example of a mode logic circuit.

The mode logic circuit 111*b* of FIG. 8 corresponds to the mode logic circuit 111*a* of FIG. 2. To avoid repeated descriptions and provide easy descriptions, a detailed description on the mode logic circuit 111*b* will focus on differences from the mode logic circuit 111*a* of FIG. 2.

The mode logic circuit 111*b* may include a multiplexer (111MUX) instead of the OR operator 111OR. The multiplexer (111MUX) may receive an output enable toggle signal (SOUTENtog) and a high level signal. The multiplexer (111MUX) may receive the output enable control signal (SOUTCTRL) from the AND operator 111AND as a selection signal, may select one of the output enable toggle signal (SOUTENtog) and the high level signal based on the output enable control signal (SOUTCTRL), and may output it as the output enable signal (SOUTEN).

In some implementations, the multiplexer (111MUX) may output the output enable toggle signal (SOUTENtog) when the output enable control signal (SOUTCTRL) is provided as a high level signal, and the multiplexer (111MUX) may output the high level signal when the output enable control signal (SOUTCTRL) is provided as a low level signal.

In some implementations, the output enable signal (SOUTEN) may be toggled at one line time when the display driver integrated circuit 100*a* of FIG. 1 is operated in the high-rate driving mode, and the output enable signal (SOUTEN) may be output with a predetermined level at one line time when the display driver integrated circuit 100*a* is not operated in the high-rate driving mode.

Figure 9:
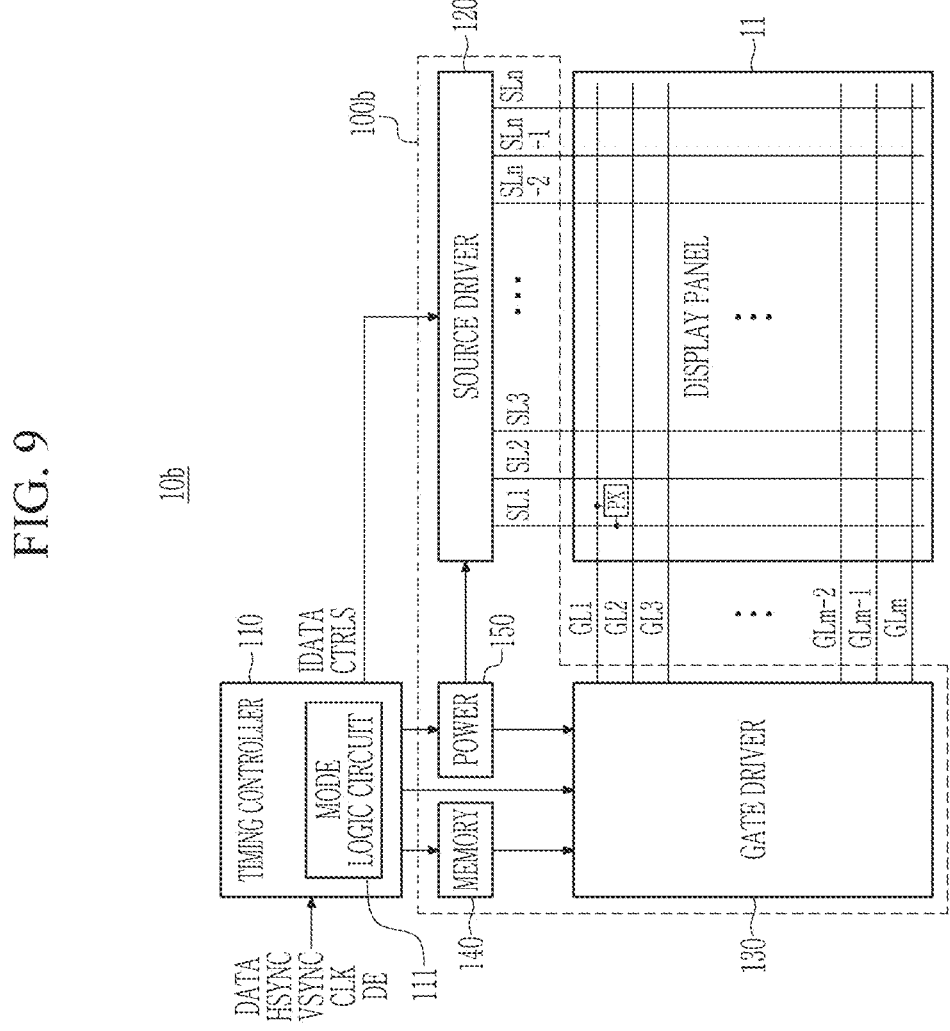
FIG. 9 shows a block diagram of another example of a display device.

FIG. 9 shows a block diagram of another example of a display device.

The display device 10*b* of FIG. 9 corresponds to the display device 10*a* of FIG. 1. To avoid repeated descriptions and provide easy descriptions, a detailed description on the display device 10*b* will focus on differences from the display device 10*a* of FIG. 1.

The display device 10*b* may include large electronic products such as TVs or monitors, but is not limited thereto.

The display device 10*b* may include a display driver integrated circuit 100*b*, a timing controller 110, and a display panel 11. The display driver integrated circuit 100*b*, the timing controller 110, and the display panel 11 may correspond to the display driver integrated circuit 100*a*, the logic block 110, and the display panel 11 of FIG. 1, respectively.

In some implementations, the timing controller 110 may not be included in the display driver integrated circuit 100*b* but may be realized into an individual chip or device. The timing controller 110 may include a mode logic circuit 111, and may provide the control signals (CTRLS) including the output enable signal (SOUTEN) of FIG. 1 to FIG. 8 to the source driver 120 through the mode logic circuit 111.

Figure 10:
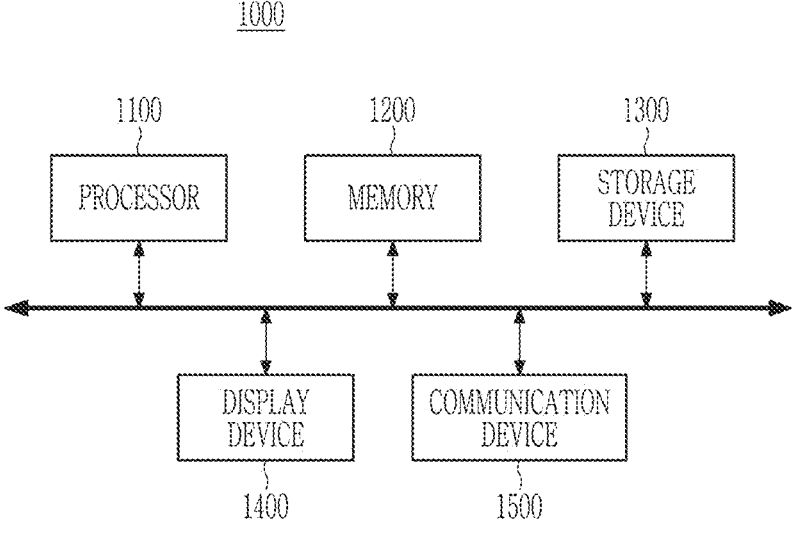
FIG. 10 shows an example of an electronic device.

FIG. 10 shows an example of an electronic device. Referring to FIG. 10, the electronic device 1000 may include a processor 1100, a memory 1200, a storage device 1300, a display device 1400, and a communication device 1500. The processor 1100, the memory 1200, the storage device 1300, the display device 1400, and the communication device 1500 may perform a data communication to each other through an internal bus.

The processor 1100 may control a general operation of the electronic device 1000. The processor 1100 may perform an operation for executing various types of software, firmware, or program codes loaded on the memory 1200. The processor 1100 may function as a central processing unit of the electronic device 1000. The processor 1100 may include one or more processor cores.

The memory 1200 may store data and program codes processed/to be processed by the processor 1100. For example, software, firmware, program codes, or instructions to be executed by the processor 1100 may be loaded on the memory 1200. The memory 1200 may function as a main storage device of the electronic device 1000. The memory 1200 may include a dynamic random access memory (DRAM), a static random access memory (SRAM), a phase-change random access memory (PRAM), a magnetic random access memory (MRAM), a ferroelectric random access memory (FeRAM), and a resistive random access memory (RRAM). The memory 1200 may also be referred to as a buffer memory or a cache memory. Differing from what is shown, the number of the memories 1200 may be one or more. Differing from what is shown, the memory 1200 may be implemented as an external device for communicating with the electronic device 1000.

The storage device 1300 may store data generated by the processor 1100 for the purpose of a long-term storage, files driven by the processor 1100, or various types of software, firmware, program codes, or instructions executable by the processor 1100. The storage device 1300 may function as an auxiliary memory device of the electronic device 1000. The storage device 1300 may include a NAND flash memory or a NOR flash memory. Differing from what is shown, the number of the storage devices 1300 may be one or more. Differing from what is shown, the storage device 1300 may be implemented as an external device for communicating with the electronic device 1000.

The display device 1400 may provide images to the user under control by the processor 1100. For example, the display device 1400 may including the logic block 110 including the mode logic circuit 111 of FIG. 1 to FIG. 9, and may perform the operation of the high-rate driving mode for each line time. The display device 1400 may perform high-rate driving at the line time requiring a high-rate driving, and may improve the EMI characteristic and power efficiency of the display device.

The communication device 1500 may communicate with an external device of the electronic device 1000 based on various wire/wireless rules. For example, the communication device 1500 may receive data from an external device or may transmit the data stored in the memory 1200 or the storage device 1300 to the external device under control by the processor 1100. In some implementations, the communication device 1500 may include a user interface for receiving data from a user of the electronic device 1000 or outputting data to the data.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While this disclosure has been described in connection with what is presently considered to be practical implementations, it is to be understood that the disclosure is not limited to the disclosed implementations, but, on the contrary, is intended to cover various modifications and equivalent arrangements included within the spirit and scope of the appended claims.

What is claimed is:

1. A display device comprising:
a source driver configured to output a data voltage based on an image data to a first source line and a second source line, the second source line being different from the first source line; and
a timing controller configured to
receive first data and second data sequentially input to a first source channel that corresponds to the first source line,
receive third data and fourth data sequentially input to a second source channel that corresponds to the second source line, wherein the first source channel is different from the second source channel,
perform an operation on the first data and the second data to generate a first change value,
perform an operation on the third data and the fourth data to generate a second change value, and
based on the first change value and the second change value, determine whether to toggle an output enable signal on an output of the second data in the first source line and an output of the fourth data in the second source line.

2. The display device of claim 1, wherein the timing controller includes:
a first buffer configured to receive the first data,
a first subtractor configured to
receive the first data from the first buffer, and
perform a subtracting operation on the first data and the second data to generate the first change value,
a second buffer configured to receive the third data, and
a second subtractor configured to
receive the third data from the second buffer, and
perform a subtracting operation on the third data and the fourth data to generate the second change value.

3. The display device of claim 2, wherein the timing controller includes:
a first mode register configured to
receive the first change value, and
compare the first change value and a predetermined first reference value to output a first channel determination value on a data variation width of the first source channel, and
a second mode register configured to
receive the second change value, and
compare the second change value and the first reference value to output a second channel determination value on a data variation width of the second source channel.

4. The display device of claim 3, wherein the first reference value is stored in a one time programmable (OTP) data form.

5. The display device of claim 1, wherein
the timing controller includes a driving mode register configured to
receive a first channel determination value on the first source channel generated based on the first change value,
receive a second channel determination value on the second source channel generated based on the second change value, and
output an output enable control signal that determines whether to toggle the output enable signal.

6. The display device of claim 5, wherein
based on the output enable control signal being a low level signal, the output enable signal is toggled, and
based on the output enable control signal being a high level signal, the output enable signal is output with a predetermined level during a line time based on a horizontal synchronization signal.

7. The display device of claim 6, wherein the timing controller includes:
an OR operator configured to perform an OR operation on an output enable toggle signal and the output enable control signal, the output enable toggle signal being toggled for a predetermined period.

8. The display device of claim 5, wherein the timing controller includes:
a multiplexer configured to
receive an output enable toggle signal and a high level signal, the output enable toggle signal being toggled for a predetermined period, and
based on the output enable control signal, output the output enable toggle signal or the high level signal.

9. The display device of claim 1, wherein
the source driver is configured to
receive the output enable signal, and
intercept an output of the data voltage on the first source line and the second source line while the output enable signal is toggled.

10. The display device of claim 9, wherein
the source driver includes
a first output switch configured to control the output of the data voltage to the first source line in the first source channel, and
a second output switch configured to control the output of the data voltage to the second source line in the second source channel, and
the first output switch and the second output switch are operable by the output enable signal.

11. The display device of claim 10, wherein the source driver includes:
a first output enable buffer configured to provide the output enable signal to the first output switch, and
a second output enable buffer configured to provide the output enable signal to the second output switch.

12. The display device of claim 11, wherein
based on the output enable signal being output with a predetermined level for a line time based on a horizontal synchronization signal, the source driver is configured to perform a low power operation for the line time.

13. The display device of claim 12, wherein
for the line time, a dynamic current does not flow to the first output enable buffer and the second output enable buffer.

14. A display device comprising:
a display panel configured to display an image through a first source line and a second source line based on a horizontal synchronization signal;
a source driver configured to output a data voltage to the first source line and the second source line based on an output enable signal; and
a timing controller configured to
determine, based on a first change value derived from data corresponding to a first source channel associated with the first source line and a second change value derived from data corresponding to a second source channel associated with the second source line, whether to operate in a first mode or a second mode, wherein the first source channel is different from the second source channel, and
toggle, in the first mode, the output enable signal at a first line time based on the horizontal synchronization signal, and output, in the second mode, the output enable signal with a predetermined level at a second line time, the second line time being sequential to the first line time.

15. The display device of claim 14, wherein
the source driver is configured to output the data voltage to the first source line and the second source line for the second line time based on the output enable signal.

16. The display device of claim 15, wherein
the source driver is configured not to perform an interception operation on an output of the data voltage for the second line time.

17. The display device of claim 14, wherein
the source driver includes a shift register, the shift register configured to
receive a latch signal from the timing controller, and
latch data that correspond to the data voltage based on the latch signal, and
the latch signal is toggled and is input to the shift register based on an edge of the output enable signal in the first line time.

18. The display device of claim 17, wherein
the data are latched to an output terminal of the shift register based on the toggling of the latch signal.

19. The display device of claim 18, wherein
at the first line time after the toggling of the latch signal, an output of the data voltage is intercepted by the output enable signal.

20. A display device comprising:
a display panel including a plurality of pixels;
a gate driver connected to the plurality of pixels through a first gate line and a second gate line that are sequentially arranged, and the gate driver configured to activate the first gate line and the second gate line sequentially;
a source driver connected to the plurality of pixels through a plurality of source lines including a first source line and a second source line, the source driver configured to
output a data voltage to the plurality of pixels through the plurality of source lines based on an output enable signal,
be operable in a high-rate driving mode at a first line time that corresponds to activation of the first gate line corresponding to the output enable signal, and
turn off the high-rate driving mode at a second line time that corresponds to activation of the second gate line; and
a timing controller configured to
determine, based on a first change value derived from data corresponding to a first source channel associated with the first source line and a second change value derived from data corresponding to a second source channel associated with the second source line, whether to operate in the high-rate driving mode or an off mode, wherein the first source channel is different from the second source channel, and
provide the output enable signal to the source driver, the output enable signal being toggled at the first line time based on the source driver operating in the high-rate driving mode and being output with a predetermined level for the second line time based on the source driver operating in the off mode.

\* \* \* \* \*